United States Patent
Baur et al.

(10) Patent No.: US 9,658,087 B1
(45) Date of Patent: May 23, 2017

(54) CNT SYNTHESIS IN CONFINED SPACE AND USE AS ARTIFICIAL HAIR FLOW SENSOR

(71) Applicant: The United States of America, as Represented by the Secretary of the Air Force, Washington, DC (US)

(72) Inventors: Jeffrey W. Baur, Liberty Township, OH (US); Matthew R. Maschmann, Columbia, MO (US); Gregory J. Ehlert, Miamisburg, OH (US); Benjamin T. Dickinson, Destin, FL (US); David M. Phillips, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 163 days.

(21) Appl. No.: 14/705,944

(22) Filed: May 6, 2015

Related U.S. Application Data

(60) Provisional application No. 61/989,337, filed on May 6, 2014.

(51) Int. Cl.
*G01F 1/56* (2006.01)
(52) U.S. Cl.
CPC ...................... *G01F 1/56* (2013.01)
(58) Field of Classification Search
CPC ............................................ G01F 1/56
USPC .............................. 73/861.08, 900
See application file for complete search history.

(56) References Cited

U.S. PATENT DOCUMENTS

| | | | | |
|---|---|---|---|---|
| 2008/0280137 | A1* | 11/2008 | Ajayan | ............... A61L 24/0078 428/375 |
| 2013/0142987 | A1* | 6/2013 | Wardle | ..................... B82B 1/00 428/98 |
| 2013/0216811 | A1* | 8/2013 | Ghasemi-Nehjad | ... B82Y 30/00 428/220 |

OTHER PUBLICATIONS

Maschmann et al., "Force sensitive carbon nanotube arrays for biologically inspired airflow sensing", Aug. 31, 2012, IOP Publishing. Smart Materials and Structures 21.*

* cited by examiner

Primary Examiner — David M Gray
Assistant Examiner — Andrew V Do
(74) Attorney, Agent, or Firm — AFMCLO/JAZ; Timothy Barlow

(57) ABSTRACT

A method for making an artificial hair sensor, comprising the steps of: (a) depositing an electrode at each end of a microcapillary having an inside surface; (b) coating a structural fiber with alumina; (c) placing the alumina coated structural fiber inside the microcapillary, wherein part of the alumina coated structural fiber is in a spaced annular relationship with the microcapillary inside surface and part of the fiber extends outside the microcapillary; (d) placing the microcapillary and alumina coated structural fiber inside a heated furnace chamber; and, (e) injecting a vaporized catalyst into the heated furnace chamber. The vaporized catalyst may be a solution of ferrocene in xylene. The microcapillary may be made of glass.

3 Claims, 5 Drawing Sheets

CNT SYNTHESIS IN CONFINED SPACE AND USE AS ARTIFICIAL HAIR FLOW SENSOR

CROSS-REFERENCE TO RELATED APPLICATIONS

This application claims the benefit of the filing date of Provisional Application Ser. No. 61/982,377, filed May 6, 2014, titled "CNT Synthesis in Confined Space and Use as Artificial Hair Sensor," and incorporates its contents by reference into this application.

STATEMENT OF GOVERNMENT INTEREST

The invention described herein can be manufactured and used by or for the U.S. Government for governmental purposes without payment of any royalty.

BACKGROUND OF THE INVENTION

This invention relates generally to synthesis of carbon nanotubes (CNTs) and to CNT coated structural fibers for use as artificial hair sensors. More specifically, the invention relates to synthesizing a radially aligned array of CNT's onto a structural fiber and using a thus CNT coated structural fiber as an artificial hair flow sensor.

Artificial Hair Sensors

Sensory hairs are common throughout the natural world, serving diverse functions in varied environments. Crickets, for example, utilize finely tuned hair arrays called cilia to rapidly detect airflow disturbances from approaching predators. Locusts use precisely arranged sensory hairs on their heads and directional impulses to navigate in flight. Hairs located on the wings of bats are thought to detect the flow pattern of air during flight for enhanced navigation and aerobatic-like flight control. This rapid detection of small-scale airflow variations via hair shaft deflection of a single sensor, or as part of a distributed array, contributes to natural flyers having greater flight agility than human engineered systems and provides inspiration for development of flow sensing systems.

Such distributed arrays of sensors form a sensory network able to detect airflow patterns (particularly boundary layer separation) across the entire surface of a wing, rather than at a few discrete locations as on a traditional aircraft. Natural flyers generally employ a network of hairs, protruding normal to their flight surfaces, which deflect to indicate boundary layer shape and localized wind speed. These hairs are often embedded in a mass of force sensitive cells which sense shear force and moment resulting from aerodynamic forces applied to each hair.

Biologically inspired artificial hair sensors (AHS) attempt to mimic the awareness and rapid response to external fluid flows of natural flyers. Engineered AHS devices have taken diverse forms to emulate biology. Most AHS designs are silicon-based and fabricated using MEMS technology in order to achieve feature sizes comparable to biological hairs (10-100 µm diameter and 1 mm length). Typical hair shaft materials include polymers, metals and micro-cantilever semi-conducting films. MEMS technologies typically use SU-8 negative photoresist polymer as a hair shaft material, resulting in soft, floppy, fibers unable to respond to and measure higher frequencies. Mechanisms for measuring hair shaft displacement include piezoresistive transduction, capacitive detection and more exotic methods such as lipid bilayer current generation. Many designs enhance the sensing of hair deflection by using extended surfaces in the transduction region or through additional deflection of the area surrounding the hair, adding additional complexity and mass to the sensor assembly. Sensitivities for detecting flow using AHS devices is approaching that of biological hairs, with minimal detectable limits on the order of 1 mm/sec. in air and 0.1 mm/sec. in water. These sensors demonstrate a possibility for achieving bio-like flow sensing sensitivities, but their typically complex fabrication, fragility, large physical footprint and unidirectional sensing capability currently prevent their application into integrated engineered systems.

So-called whiskerized fibers, fibers surrounded by a vertically aligned array of smaller fibers, or whiskers, offer materials scientists new possibilities for manipulating many structural and functional properties, including interlaminar toughness, thermal conductivity, electrical conductivity, delamination resistance and shear strength.

Whiskerized fibers are structurally similar to circular hairbrushes (although much smaller), visually similar to pipe cleaners (although smaller) and often referred to as fuzzy fibers.

Whiskerized fibers can be part of an important type of structures called hierarchical structures. Hierarchical structures are structures where the structural elements themselves have structure. This structural hierarchy can produce new and extraordinary bulk material properties, and guide synthesis of new materials with physical properties specifically tailored for specific applications.

Hierarchical structures, or structural composites, are common in nature and mimicking those structures offers significant improvements over and to existing human engineered structures.

Much of the initial research in whiskerized fiber architecture focused first on carbon fibers with carbon nanofiber whiskers, and later on carbon nanotube whiskers. The superlatives associated with CNTs (strength, stiffness, electrical conductivity and thermal conductivity) have increased their popularity as a whisker material and the chemical similarity to carbon fiber enhances compatibility.

The prior art for making CNT coated fibers, including whiskerized fibers, generally uses standard methods for growing CNTs, but for making radically different morphologies.

Previous efforts at making hierarchical structures required growing nanomaterials on thermally sensitive substrates, followed by separate, high-precision assembly steps to complete a hierarchical structure.

These precision-based processes add significant fabrication complexity, cost and other limitations to making new, and possibly valuable, hierarchical architectures.

A particular problem with prior art approaches for growing CNTs is that they do not work well on curved surfaces, such as on fiber surfaces.

These fabrication difficulties have limited the number of studies examining both how to control CNT morphology grown on fibers and the effect of CNT morphology on those coated fibers. Thus, a major component for designing and optimizing structural composite material systems with arrays of CNT materials is currently lacking.

Carbon Nanotube (CNT) Coated Fibers

As stated, the many unique physical and electrical properties of CNTs are finding application for a greatly increasing variety of uses. However, even where those properties show promise for a particular use, such as, but not limited to, using CNT coated fibers as Artificial Hair Sensors, not only must the problem of how CNTs might be used be solved; how to make, or synthesize, CNT structures for those new uses can be an even bigger problem.

The prior art includes many different synthesis methods for making CNTs, including arc discharge, electrolysis, laser ablation and chemical vapor deposition.

As stated, support substrates are generally difficult to modulate with high curvature substrates such as structural fibers. Many thin film deposition techniques are directional or line of sight and limit the options for obtaining a uniform film on a fiber.

Additionally, CNTs typically do not grow well onto carbon or glass fibers.

Practical prior art structural composites, both using CNT arrays and otherwise, are largely limited to planar assemblies based on growth of aligned nanomaterials from a planar substrate.

A limitation of planar arrays is a large footprint, limited directionality of application and limited ability to integrate into structural composites.

Current fiber-based nano-device processing is limited to sequential layers, precise deposition, and a need for complex schemes to access concentric electrodes.

It is clear, therefore, that artificial hair sensors are needed that better mimic biological hair sensors.

It is also clear that new approaches for CNT synthesis are needed, particularly for growing CNTs onto structural fibers for making hierarchical structures that can, among other uses, be incorporated into biologically inspired artificial hair sensors.

SUMMARY OF THE INVENTION

The present invention solves the problems of the prior art with a new approach for growing, as opposed to fabricating, CNTs onto substrates using low-cost and widely available micrometer-scaled materials such as structural fibers and glass capillaries, to create high-precision nano-devices based not on traditional microelectronic and MEMS-based fabrication approaches, but by simple preferential growth of nanomaterials on one substrate as opposed to another. The cost and time of prior art foundry fabrication approaches are avoided while the apparatus self-assembles through growth.

An apparatus and method for synthesizing carbon nanotubes (CNTs) inside a confined space (i.e. a microcapillary) makes possible growing CNTs selectively on a surface inside the confined space and not on the inner walls of the confined space. A disclosed example embodiment grows a radially-aligned array (similar to a cylindrical hair brush with radially-arranged bristles, but much smaller) of CNT fibers onto a structural fiber inside a microcapillary tube. The CNT fibers grow preferentially on the structural fiber and not on the inside surface of the microcapillary tube. A thin film of aluminum oxide is deposited onto a structural fiber. Each thus coated structural fiber is then inserted into a microcapillary to form a pre-assembly. Pre-assemblies are placed inside a partially pre-heated furnace in a mixture of Ar and $H_2$. A mixture of ferrocene and xylene is injected into the furnace to begin CNT synthesis. CNTs will preferentially grow on the aluminum oxide coated structural fiber, filling the annular space between each fiber and each inside wall of the capillaries.

For use as artificial hair sensors, microcapillaries are cut to a length shorter than the structural fibers; their ends polished and sputtered with Au—Pd at opposite cut and polished ends to form electrodes at each end. Aluminum oxide and catalyst coated structural fibers are then each inserted into respective microcapillaries, leaving an exposed section of the structural fiber outside each microcapillary, to form a pre-assembly; then processed inside a furnace as described above to grow a radially-aligned array of CNT fibers on the portion of each structural fiber inside each microcapillary. The completed assemblies are mounted into a suitable support surface as artificial hairs. The exposed fiber sections will bend in response to gas flows, the bending moments transferring to inside the microcapillaries, compressing the aligned CNTs near where the structural fiber extends out of the microcapillary, reducing the resistance between the electrodes and providing a measure of flow much more sensitive than possible with prior art artificial hair assemblies.

The invention grows CNTs onto a structural fiber while inside a microcapillary. The CNTs grow preferentially onto an alumina coated structural fiber and not on the inside walls of the microcapillary.

Structural fibers are fibers sufficiently stiff to work for their intended uses.

The new teachings of the present invention include applying a conformal thin film of $Al_2O_3$ onto the surface of individual structural fibers to serve as a support substrate. The structural fibers are then inserted inside microcapillaries and placed inside a furnace. A catalyst layer is continuously supplied through vaporization of a liquid injection of catalyst, such as a solution of ferrocene in xylene. The CNTs preferentially grow onto the $Al_2O_3$ coated fiber surfaces and not onto the inside surfaces of the microcapillaries.

The teachings of the invention can be used to create arrays of high aspect ratio nanomaterials in an annular region inside the microcapillary, between surfaces (e.g. between the structural fiber and the inside wall of the microcapillary) through site specific growth in order to nano-enable functional devices that can be integrated into structural composites.

An advantage of the teachings of the present invention are that CNT growth self-aligns the fiber at the center of the assembly to achieve, for example, precise self-centering of fibers inside a capillary to maintain a consistent gap.

Another advantage of the teachings of the present invention is that its surface preparation teachings result in extremely high CNT densities on fibers.

The concentric geometry exploits the mechanical, thermal, and electrical anisotropic properties of the high aspect ratio nanomaterials in a more compact package than a planar device.

Another advantage of the teachings of the present invention is that it overcomes many of the prior difficulties of growing CNTs onto carbon and glass fibers.

For making an artificial hair sensor (AHS), a length of fiber extends outside the microcapillary and a CNT array is grown in the annular area between the inside wall of the microcapillary and the structural fiber. Electrodes are applied to opposite ends of the microcapillary before or after placing inside a furnace. Selective synthesis of nanoscale materials onto pre-assembled devices prevents damage that may occur if a nanomaterial-coated member is inserted into an annulus with little to no clearance. The concentric synthesis of site-specific nanomaterials leads to a self-centering effect of a host substrate within an annulus (e.g. of the microcapillary) and the ability to fully occupy the assembly surfaces.

External stimulation of the hair shaft, the fiber extending outside the microcapillary, transfers to the fiber inside the microcapillary, locally compressing the piezoresistive CNT array and changing the measurable resistance between the electrodes, providing a measure of outside fiber movement.

The high compliance of a relatively "soft" CNT array largely decouples fiber deformation from a microcapillary holder.

A particular advantage of the teachings of the present invention are that it results in significant electrical resistance changes in response to static and dynamic hair deflection, even at deflections of less than 1 μm.

The example concentric geometry embodiment of the present invention allows for current collection along a one-dimensional structural fiber that can easily connect to additional electronics or integrate into a structural composite.

The large surface area and low mass fraction of the nano-arrays provide a high surface area template to place additional materials, such as atomic layer deposition (ALD) films, nanoparticles, organic molecules, etc.

A single fiber or plurality of fibers (structural or other fibers) having a diameter of 6.5 μm or greater can be inserted into a confined geometry or pore having a diameter greater than that of the fiber. Preferential growth of carbon nanotubes on the fiber can be achieved to fill the region between the outer fiber diameter and the inner surface of the pore or confined geometry.

The pores may have a high aspect ratio of 80 to 1 (depth vs. width) with pores as small as 15 μm.

The invention leads to precise self-centering of the fiber within the capillary to maintain consistent gap.

The preferential growth of the CNTs in the annulus region happens with unfunctionalized surfaces and eliminates the need for surface preparation or functionalization.

The concentric geometry exploits the mechanical, thermal, and electrical anisotropic properties of the high aspect ratio nanomaterials in a more compact package than a planar device.

The concentric geometry allows for current collection along a 1D structural fiber which is easily connected to additional electronics or integrated into a structural composite.

The large surface area of the nanoarrays and low mass fraction (~1 vol %) provides a high surface area template to place additional materials (ALD films, nanoparticles, organic molecules, etc.).

The high compliance of a relatively "soft" CNT array largely decouples the fiber deformation from the capillary.

The CNT coated structural fibers are able to be incorporated into affordable biomimetic flow sensors with improved size, weight and power which can significantly impact non-evasively airflow sensing over a surface, measuring angle of attack, sensing a responding to gusts, visualizing aerodynamic surface effects, and monitoring the processing of polymer composites.

The CNT coated structural fibers are able to be incorporated into both rigid and flexible substrates.

Significant electrical resistance changes are observed in response to both static and dynamic hair deflections—even at deflections of less than 1 μm.

The sensors offer an extended region of operation with a nearly linear response including at high frequency. Wind tunnel testing shows that the artificial hair sensors are sensitive to low-speed air flows and provide repeatable operation.

The hair length is easily adjusted.

BRIEF DESCRIPTION OF THE DRAWINGS

The present invention will become more apparent from the following detailed specification and drawings.

DETAILED DESCRIPTION

The present invention grows carbon nanotube fibers (CNTs) onto a structural fiber while inside a microcapillary. The CNTs grow preferentially onto an alumina coated structural fiber and not on the inside walls of the microcapillary, forming a forest of CNT fibers on the structural fiber.

The new teachings of the present invention include applying a conformal thin film of alumina ($Al_2O_3$) to the surface of individual structural fibers to serve as a support substrate. This may be accomplished by atomic layer deposition. The structural fibers are then inserted inside microcapillaries and placed inside a furnace. A catalyst layer is continuously supplied through vaporization of a liquid injection of catalyst, such as a solution of ferrocene in xylene. The CNTs preferentially grow onto the alumina coated fiber surfaces and not onto the inside surfaces of the microcapillaries.

Figure 1:
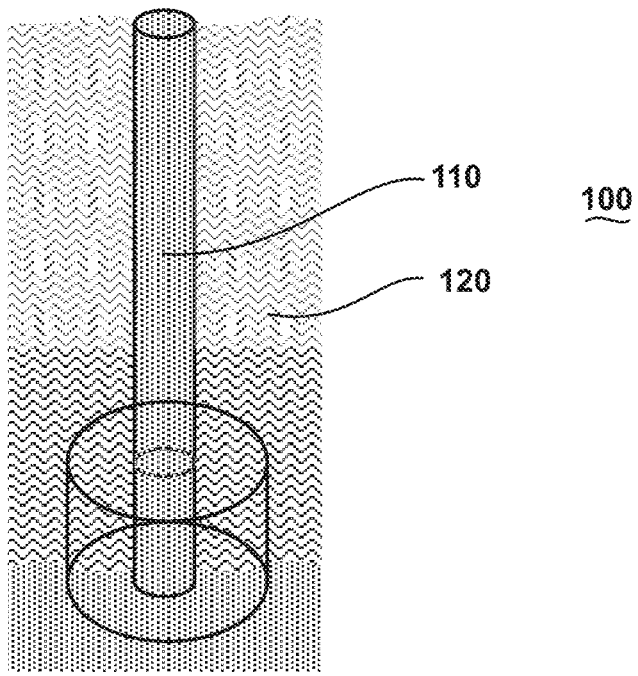
FIG. 1 is a schematic view of a length of a conceptual CNT coated structural fiber showing a structural fiber coated with multiple CNT whiskerized fibers in an arrangement similar to a circular hair brush.

The present invention additionally includes making artificial hair sensors by adding electrodes to the just described CNT fiber assemblies with a bit of carbon structure sticking out like a hair from a hair follicle FIG. 1 is a schematic view of a length of a CNT coated structural fiber 100 comprising a structural fiber 110 coated with multiple CNT whiskerized fibers 120 in an arrangement similar to a circular hair brush.

Figure 2:
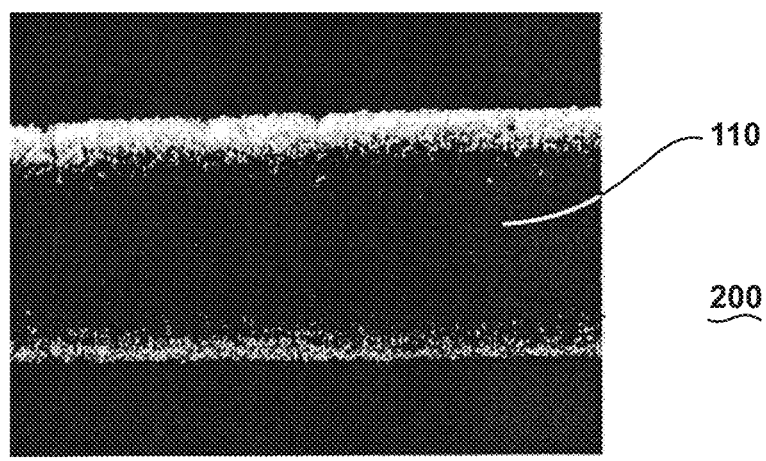
FIG. 2 is an image of an example embodiment of a CNT coated structural fiber made according to the teachings of the present invention.

FIG. 2 is an image of an example embodiment of a CNT coated structural fiber 200 made according to the teachings of the present invention showing a surrounding array of whiskerized fibers 220.

Figure 3:
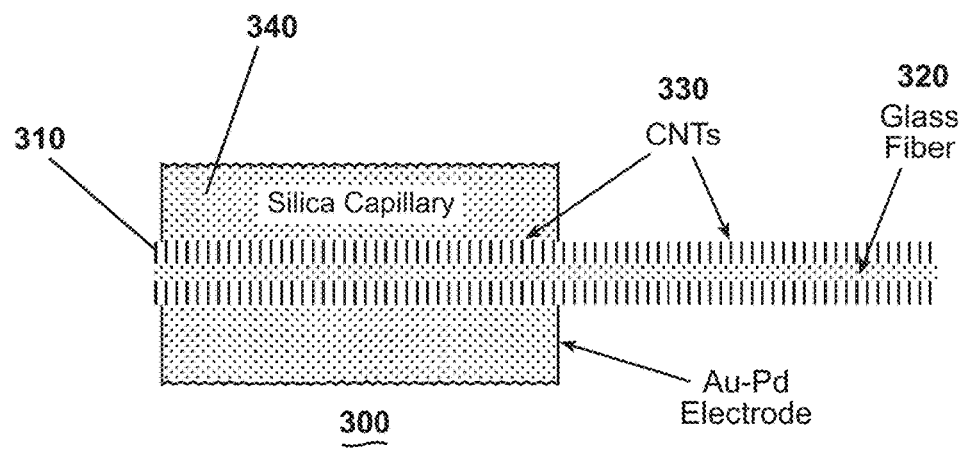
FIG. 3 is a schematic view of an example embodiment of a CNT coated structural fiber made according to the teachings of the present invention; and, further showing its use as part of an artificial hair sensor made according to the teachings of the present invention.

FIG. 3 is a schematic view of an example embodiment of a CNT coated structural fiber 310 made according to the teachings of the present invention; and, further showing its use as part of an artificial hair sensor 300 made according to the teachings of the present invention.

A structural fiber 320, here made of glass, but which may be made of any suitable material, is coated with an array, or forest, of CNT fibers 330.

Structural fiber 320 sits inside a glass microcapillary 340. Such capillary, or microcapillary, tubes are named for their typical size, suitable for moving liquids by capillary action, and not because they are used only as capillaries.

Figure 4:
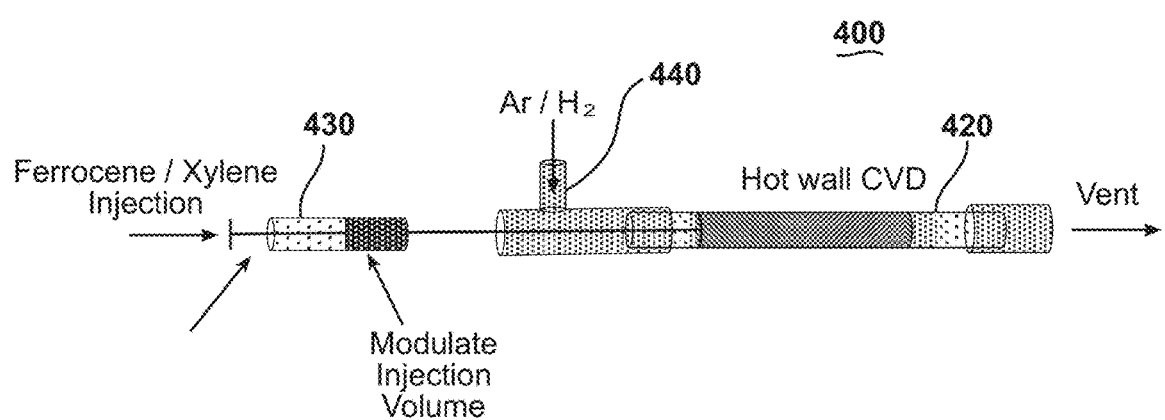
FIG. 4 is a schematic view of an example embodiment of an injection growth furnace apparatus for making a CNT coated (or any nano-coating) assembly according to the teachings of the present invention.
Figure 5:
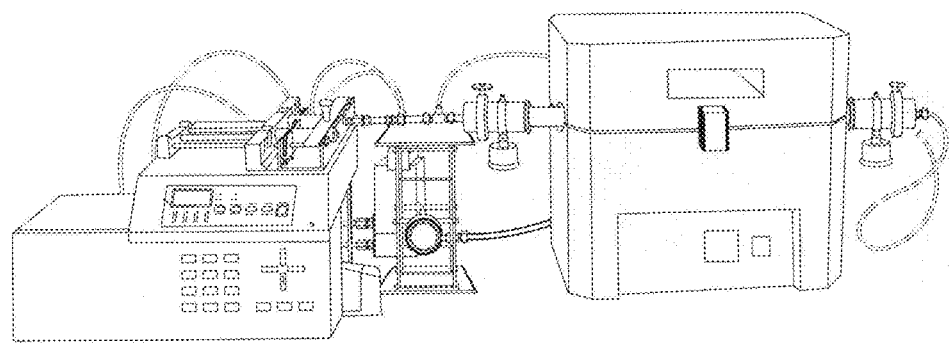
FIG. 5 is a more detailed image of an example embodiment of an injection growth furnace apparatus for making a CNT coated (or any nano-coating) assembly made according to the teachings of the present invention.

FIG. 4 is a schematic view of an example embodiment of an injection growth furnace apparatus 400 for making a CNT coated (or any nano-coating) assembly according to the teachings of the present invention, and FIG. 5 is a more detailed image of an example embodiment of an injection growth furnace apparatus 500 for making a CNT coated (or any nano-coating) assembly made according to the teachings of the present invention.

Injection growth furnace 400 includes a hot wall chemical vapor deposition section, or furnace tube, 420, along with ports 430 and 440 for injecting catalysts and process gases.

CNTs were synthesized using an injection catalyst CVD method. Glass fibers were coated with 10 nm $Al_2O_3$ (aluminum oxide or alumina) using atomic layer deposition, then optionally 2 nm Fe using ion beam sputtering for selective growth on the fiber. Synthesis occurred at 750° C. using 500 sccm Ar and 50 sccm $H_2$. A 5 wt. % solution of ferrocene in xylene was injected at 2.5 mL/hr using a syringe pump for approximately 15 minutes. The CNT diameter distribution ranged from 5-30 nm.

Fibers were either used as received or coated with 100 cycles (~10 nm) of $Al_2O_3$ through atomic layer deposition. Fibers were then optionally coated with 2 nm of Fe catalyst using ion beam sputtering. Quartz micro capillaries (325 µm outer diameter, 25 µm inside diameter) are prepared by first cutting (1.4 mm long) and polishing. If desired, the capillaries are sputtered with Au—Pd on each side to form electrodes for contact with the CNTs. Individual fibers are selected and inserted into the capillaries to complete the pre-assembly. CNT synthesis was conducted in a 2.54 cm Lindberg Blue Mini Mite quartz tube furnace 510, shown in the more detailed view of FIG. 5. Prior to growth, furnace tube 420 was first baked to 950° C. and then cooled below 200° C. before loading samples to improve consistency. The assemblies were supported on a graphite substrate and placed into the tube. Ferrocene (5 wt. %) and xylene was mixed briefly under sonication, and loaded into a 5 mL programmable syringe pump. The substrate was ramped to 750° C. in 15 minutes under 500 sccm of Ar and 50 sccm of $H_2$ (both research grade purity). Once heated, the injector tube between the syringe and the hot zone of the furnace was primed with 0.5 ml of solution at 60 times the desired injection rate. The injection volume of the ferrocene/xylene mixture was varied from 0.75 to 0.85 ml during growth at 750° C. and the carbon concentration was independently varied from 0.23 mole % to 1.44 mole % through injection rate control. The time of growth varied depending on the injection rate/precursor concentration, what was controlled was the volume of injected fluid. After growth, the injection tube was immediately evacuated to minimize evaporation of any excess precursor solution and the system cooled to room temperature under 500 sccm of Ar.

The ferrocene breaks up into iron and carbon, the carbon being deposited on the structural fiber, such that initial preparatory Fe coating may not even be necessary.

Figure 6:
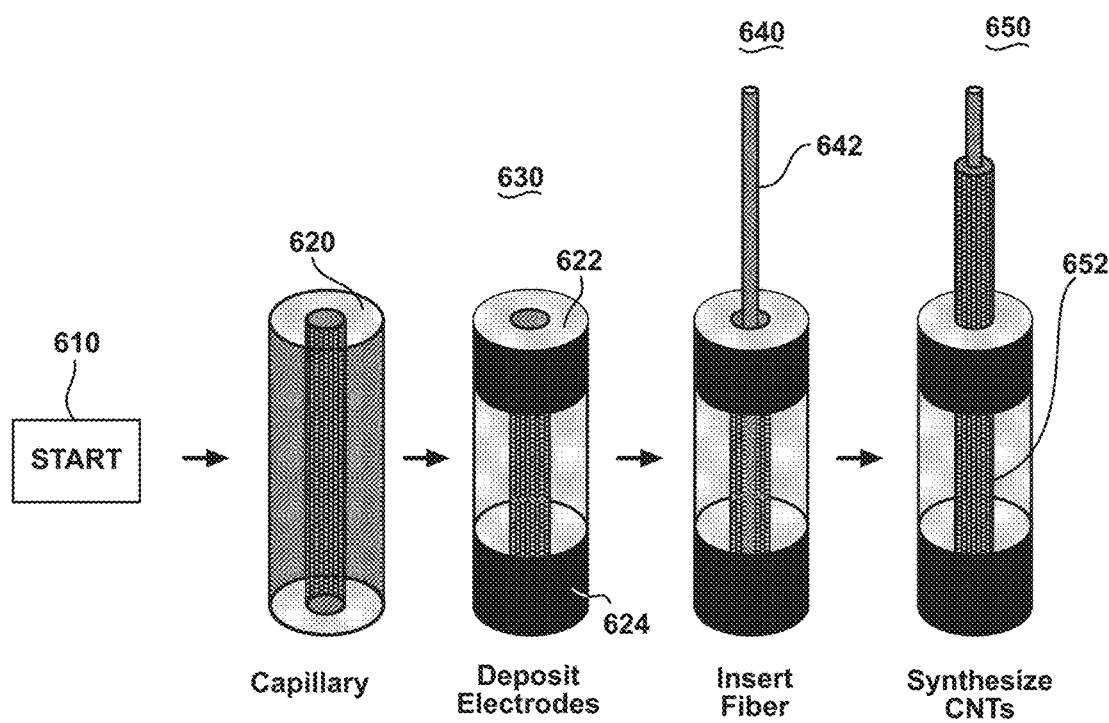
FIG. 6 is another schematic view of an assembly of an example embodiment of an artificial hair sensor made according to the teachings of the present invention.

FIG. 6 is schematic view of an assembly of an example embodiment of an artificial hair sensor 610 made according to the teachings of the present invention. FIG. 6 shows the steps of making artificial hair sensor 610 as first providing a microcapillary 620, depositing 630 electrodes 622 and 624 on each end of microcapillary 620, inserting 640 a structural fiber 642, including allowing part of the length of structural fiber 642 to extend outside microcapillary 620, followed by synthesizing 650 a CNT coating 652 as previously described.

The CNT coated glass fibers were synthesized using a variety of xylene/ferrocene precursor concentrations, total precursor injection mass, and catalyst support substrates to tailor CNT morphology on the hierarchical fibers. The injection chemical vapor deposition continuously delivers catalyst particles through the gas stream by decomposing ferrocene in a xylene solution. Modulating the amount of carbon precursor and carbon concentration affects the resulting CNT length and diameter, while changing the support substrate (alumina, silicon dioxide and others) affects catalyst particle evolution. Catalyst particles diffuse into and through the support layer, limiting catalyst lifetime. They also migrate, ripen and coalesce on the surface, affecting CNT diameter.

The aluminum oxide coating creates, in effect, good topsoil for growing CNTs, as opposed to the clay of an uncoated substrate.

CNT Morphology

Returning now to FIG. 2, the morphology of the CNTs was first studied qualitatively by a scanning electron microscope (SEM). The CNTs grow from the fiber in a dense forest with relatively high radial alignment relative to the host fiber. As the CNTs grow away from the fiber, the numerical density of CNTs remains constant while the volumetric density decreases. At sufficient CNT lengths, strong van der Waals force between the CNTs causes the forest to split and form what is referred to as "mohawks." These features occur in longer CNT forests as the formation of a split appears to propagate down to the base fiber and continue throughout additional growth of the CNT array. These can be prevented by keeping the CNTs shorter (reducing injected carbon precursor) and by keeping the CNT alignment and density lower by using a $SiO_2$ catalyst support.

The first measurements made were the overall coated diameter of the fibers. The diameter of the fibers linearly grows with increasing injected volume of the ferrocene solution, with a plateau region near the upper limit tested. Measurements of the total outer diameter of the fiber in SEM images show a general trend of increasing CNT length with injected volume. The fibers derived from high injected volumes (0.83 ml and 0.85 ml) show a slight decrease in CNT length, which is unexpected. Fibers with high injected volumes often do not grow a uniform CNT coating around the entire fiber perimeter. The nature of the mohawked fibers makes measuring effective CNT length difficult, as well as overall diameter. The non-uniform diameter of the hierarchical fibers means that measurements depend on the orientation of the fiber, which is difficult to control and verify.

Increasing injection volume leads to longer CNTs, even if mohawking limits the measured length at high injection volumes. While diameter measurements represent a partial indicator of morphology, thermogravimetric analysis (TGA) measures the relative mass of CNTs and provides additional information.

High resolution images of individual CNTs were also captured to examine the specific morphology of the CNTs, including numerical density, local alignment, and CNT diameter. There are few obvious trends relating to injected precursor volume or carbon precursor concentration; however the CNTs grown on an $SiO_2$ base layer appear lower in numerical density, wavier, and less aligned than CNTs grown on a $Al_2O_3$ base layer. In addition, CNTs grown on a $SiO_2$ support layer seem to have more variability and a broader range of CNT diameters. Average CNT diameter measurements had such large variation within one sample that no statistically significant difference was observed. Given these limitations in the observed data, the diameter of CNTs grown on a $SiO_2$ base layer is equal to or larger than those grown on $Al_2O_3$ base layer. Generally speaking, alumina base layers tend to preserve catalysts and have lower ripening rates than those on silica, leading to higher numerical density of smaller diameter CNTs. This work contrasts with many of the previous works that deposit CNTs onto graphite substrates directly because the coalescence of the particles is dramatically different. The resulting CNT forest has a high density of smaller diameter CNTs than previous methods for creating hierarchical fibers. Furthermore, CNTs grown on alumina base layers are suitable for millimeter long CNT growth procedures and CNTs grown through this method show few limitations in length; whereas short catalyst lifetimes on graphite supports limits the achievable length of CNTs.

After analysis of the hierarchical fibers under a microscope, the fibers were analyzed for the mass of CNTs with TGA. The fibers were heated in air and any carbon was oxidized. The mass fraction removed during oxidation was plotted to help confirm the SEM measurements of diameter on hundreds or thousands of fibers that would simply not be achievable through other means. Unfortunately, there are also some assumptions in this method that could influence the results. First, the Fe catalyst is not removed, rather it remains on the fibers and picks up oxygen, making exact computation of the number tubes difficult, but still allowing for relative comparisons of carbon content. Second, this assumes that the reaction yield of CNT growth is the same. This is a reasonable assumption as it pertains to the samples with the alumina base layer, but comparing the silica and alumina base layers, one can surmise that there may be unreacted carbon deposited onto the fibers, which would add mass. The data show gradual increase in relative mass with increasing injected volume, indicating that the CNT length grows with time. Some notable anomalies exist in the data, specifically 1.44% mol 0.79 ml injected volume is anomalously high and 0.23% mol 0.80 ml is low. The latter does appear to be abnormally small and could have been inhibited in some way during the growth due to contamination, since only one growth run per sample was performed. The former may have had some fibers fly off of the pan leading to excessive weight loss. In spite of these outliers, the SEM data is largely confirmed by the TGA data.

The alignment of the CNTs is also observed in SEM images, and the CNTs appear to be relatively well-aligned perpendicular to the surface of the fiber, with localized waviness present on the individual CNT scale. The top, or furthest radial position of the CNTs, appears to have the typical crust layer characteristic of CNT array growth. The $SiO_2$ catalyst support layer of the bare fiber surface shows a dramatic change in the morphology of the CNTs, i.e. lower density and alignment. The CNTs appear to have far less uniformity, with spurious tubes branching off. Additionally, the crust layer typical of high density, high alignment CNT growth does not appear present on the fibers with the $SiO_2$ base layer. Mohawking is not observed in the $SiO_2$ base layer, either due to lower CNT density, reduced alignment, or the limited growth of the CNTs because of reduced catalyst lifetime.

The overall CNT length increases with increasing injection volume, with a plateau reached somewhere near the upper injection volume tested, 0.83 to 0.85 ml. Additionally, injected carbon precursor concentration (injection rate) does not appear to significantly impact the CNT morphology. Carbon concentrations beyond 1.44% mol (in the gas stream) led to condensation of the precursor on the outlet of the quartz furnace tube, or the upper limit for precursor concentration given the length of the reactor (tube). It is possible that slowing the gas flow rate through the tube would allow for even higher carbon concentrations by allowing more time for the precursor to react while moving along the tube; however this would also affect the temperature distribution within the reactor, particularly at the injector outlet, and thus was excluded from this study.

Hair Sensor Fabrication and Testing

After developing control of CNT morphology on the fully exposed fibers, efforts were undertaken to assemble a hair flow sensor utilizing the hierarchical fibers, as shown in FIG. 6.

Figure 7:
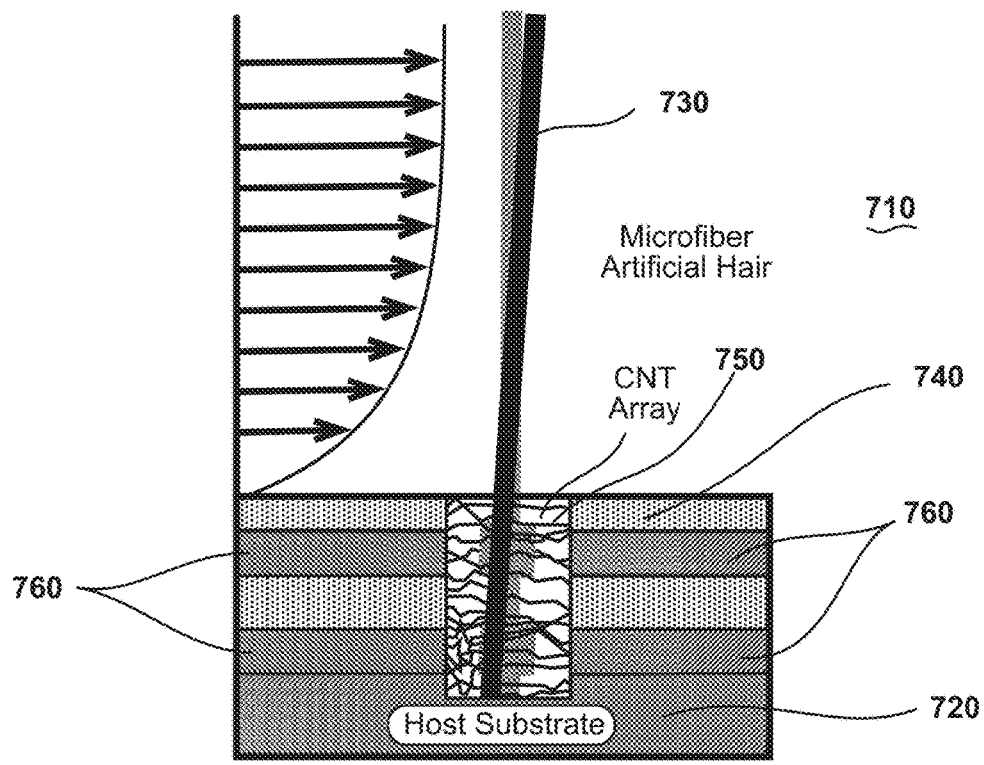
FIG. 7 is a schematic view of an example embodiment of an artificial hair sensor and substrate made according to the teachings of the present invention showing a schematic example operation of the sensor function.

FIG. 7 shows a schematic view of an example embodiment of an artificial hair sensor 710 and substrate 720 made according to the teachings of the present invention and introduces the concept of a highly-sensitive "hair plug" style AHS device for omnidirectional detection of low-speed airflow. An assembled device consists of a single CNT-coated microfiber (7-25 μm diameter) 730 embedded in a glass microcapillary 740, avoiding MEMs fabrication techniques. External stimulation of the hair shaft imparts localized compression of the piezoresistive CNT coating 750 against sensing electrodes 760 located on the wall of a microcapillary pore 770 which function as a notional "nerve cell." AHS hair plug 710 can easily be integrated into a membrane or surface through potting into a host materials, including flexible and deformable materials such as silicone rubber. The footprint of the integrated device is determined by the outer diameter of the microcapillary, typically between 150-350 μm. The sensor is highly durable, capable of withstanding hair deflection exceeding the length of the exposed hair shaft without inflicting sensor damage.

The fiber flow sensors are constructed by first cutting (1.4 mm long) and polishing quartz micro capillaries (325 μm outer diameter, 25 μm inside diameter). The capillaries may be cut to approximate length with a diamond saw, and the top and bottom ends (normal to the pore axis) may be polished smooth with alumina powder. The capillaries (i.e., glass fibers or GF) are then sputtered with Au—Pd on each side to form electrodes for contact with the CNTs. Individual CNT-GF are then selected and inserted into the sputtered capillaries to complete the assembly of the sensor components, or the CNT arrays are grown on bare fibers in the capillaries, as described above. Capillaries are then inserted lengthwise into a substrate (e.g., a silicone sheet) to expose the top and bottom electrodes. The silicone sheet serves as a structural support to hold capillaries vertically and as a physical mask to define a gap between the top and bottom electrodes. Electromechanical characterization was performed using an MTS Nanoindenter XP system and a 100 μm diameter cylindrical flat punch. Each sensor assembly is placed on a PDMS sample stage patterned with Au/Pd electrodes with a 0.8 mm gap. A constant electrical current was supplied between the sputtered capillary electrodes using a Keithley 2660 precision current source, while the voltage drop across the capillary was measured using a National Instruments BNC-2120 data acquisition system that interfaced directly with the nanoindenter control software.

Figure 8:
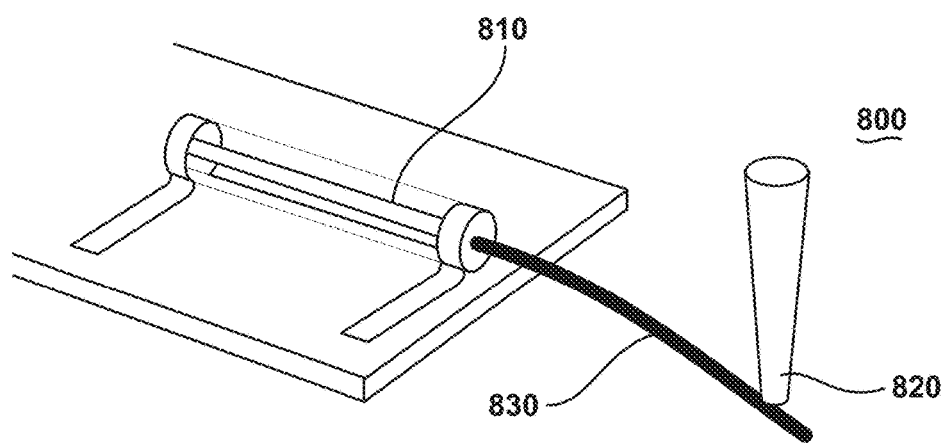
FIG. 8 is a schematic view of an example embodiment of an artificial hair sensor made according to the teachings of the present invention showing an experimental test setup used to obtain its electrical response to deflection.

FIG. 8 is a schematic view of an example embodiment of an artificial hair sensor 810 made according to the teachings of the present invention showing an experimental test setup 800 used to obtain its electrical response to deflection.

To begin the test sequence, an indenter tip 820 approached a fiber 830 from a distance of 20 μm at a displacement rate of 500 nm/sec. Contact between the indenter tip and fiber was determined by a change in electrical resistance rather than a contact force, as the stiffness of the deflecting fiber was within the noise floor (<5 N/m) of the instrument. Fibers were contacted at between 300-1000 μm from the capillary. The maximum fiber deflection varied from between 20-100 μm based on the location indented.

Figure 9:
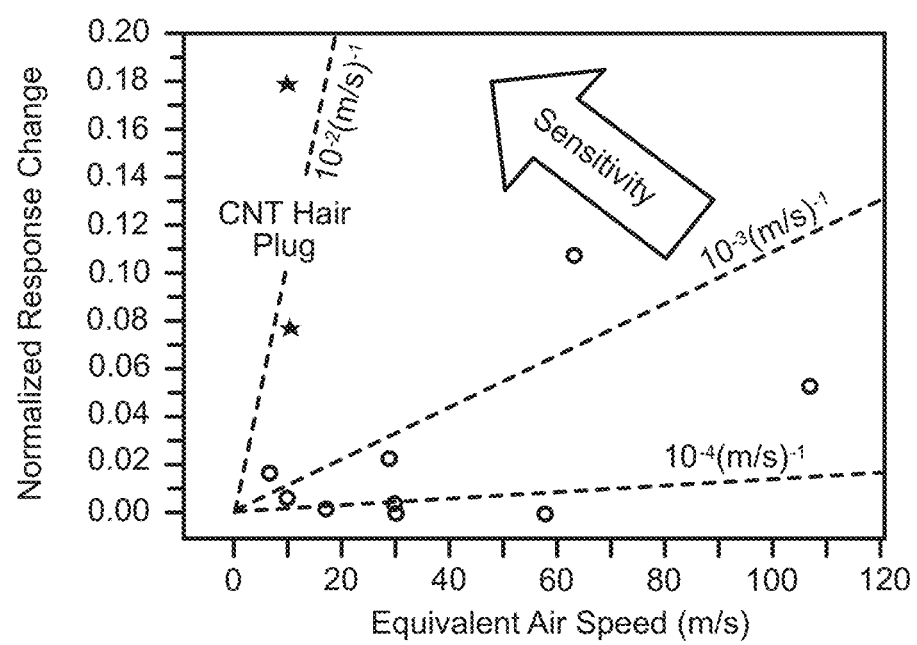
FIG. 9 is a graph of normalized response of an example artificial hair sensor made according to the teachings of the present invention showing enhanced sensitivity over literature reported prior art results.

FIG. 9 is a graph of normalized response of an example artificial hair sensor made according to the teachings of the present invention showing enhanced sensitivity over literature reported prior art results.

As part of additional deflection tests, in situ SEM mechanical characterization was conducted within a Quanta ESEM using a custom mechanical test frame and a 40 μm wide diamond flat punch tip. Deflection sequences were obtained by stepping the indenter tip in 500 nm increments at various locations along the free length of the fiber. Fiber deflection was approximately 40 μm.

The responsiveness of the AHS to steady boundary layer airflow was examined using an optimized Blasius flat plate mounted in an open test section low-Reynolds number wind tunnel. The pitch angle was held at 0 degrees for all tests with free stream velocity ranging from 0 to 10 m/sec. The hair plug sensor was integrated into a polycarbonate disc assembly and mounted flush with the test surface 35 cm from the leading edge. The boundary layer profile over the plate was characterized with a boundary layer hotwire anemometer and was found to agree well with laminar flow theory.

The AHS response to the free stream velocity change was a change in resistance, closely resembling the ramps and constant velocity holds of the free stream cycling over nominal velocities ranging from 1 to 10 m/s. Over this velocity range, we find a proportional and repeatable relationship between flow velocity at the hair tip and resistance output with a sensitivity of 1.3% resistance change per 1 m-s-1 change in air speed. This large response is between 5-100 times more sensitive than AHS devices previously reported, and operates in a low-velocity environment suitable for small air vehicles.

The piezoresistive response of the sensor was further examined using nano-indentation to precisely control hair deflection at a prescribed location. At 25 μm of fiber shaft deflection at a contact location 500 nm from the pore opening, the electrical resistance of the sensor decreased 30% relative to the undeflected resistance. An expanded region of nearly linear response between 5-20 μm of displacement was observed during the loading stroke, with a sensitivity of approximately 0.018 μm-1, or 1.8% resistance change per micron of deflection. Unloading the sensor resulted in a modestly hysteretic resistance path, in part related to the known mechanical hysteresis of the CNTs. No permanent deformation to the CNTs or resistance change of the sensor was noted upon unloading and subsequent test yielded identical results. A similar magnitude of piezoresistive response was obtained by locally compressing the unassembled CNT-coated fibers against electrodes patterned on glass substrates, as reported in the Supporting Information.

Artificial Hair Sensor Applications

The lessons learned on morphology control help guide implementation of fuzzy fibers in a functional device such as artificial hair flow sensors. Artificial hair flow sensors based on structural fibers offer higher bandwidth, owing largely to the high stiffness and low modulus of the fibers, and easier construction than silicon based devices because there are no limits on aspect ratio that lithographic methods would have. As the CNTs are compressed in the annular region between the CNT coated structural fiber and the inside wall of a microcapillary, the resistance through them decreases and can be used as a sensing mechanism. This architecture is readily scaled (in quantity) and requires fewer fabrication steps than lithographic pattern-etch methods that dominate the literature.

The example embodiment architecture is contingent on the ability to insert an appropriately sized fiber into the pore. We employed the CNT length control methods outlined earlier to achieve a fiber diameter very near the pore inner diameter, but small enough to fit in. It should be noted that if one utilizes a significantly smaller fiber outer diameter, the fiber tends to flop from side to side and has dramatically different baseline resistance values, depending upon which side it flops to. This required assembly under an optical microscope and a steady hand, but is achievable with practice.

The sensor was subjected to a known actuation in a nanoindenter to verify the sensing mechanism. The sensor was laid down laterally onto patterned electrodes that contacted the surface electrodes on the capillary. Once in place, the nano-indenter was used to actuate the free end of the fiber in both a pseudo static and dynamic loading. It should be noted that the small diameter and configuration of the sensor meant the load applied to the fiber was below the noise threshold of the nano-indenter—already an extremely sensitive instrument. The resistance decreases as the fiber displaces and shows some hysteresis. The resistance through a CNT array decreases with applied force through two mechanisms: increased contact between individual CNTs in the array and increased contact due to bending of the CNTs at the electrode surface. We observe that this combination of effects reduces the measured resistance and this is able to sense the deflection of the hair.

A deflection test was performed under the view of the SEM to verify that hair deflection was occurring as we had suspected and to verify that the deformation of the CNTs appeared elastic. The deformation is primarily the fiber itself, with small loads being transferred to the CNT support and small deformations in the supporting CNTs. While we were unable to simultaneously measure the resistance while under observation, the confirmation of small CNT deflection visually serves to reinforce the mechanisms that we propose.

To examine dynamic response, a sinusoidal signal with 1 μm displacement amplitude was superimposed to a constant deflection of approximately 12 μm. Driving frequencies of 1-10 Hz were examined. As seen in FIGS. 3c and 3d, the sensor resistance was modulated by approximately 15% and oscillated with a frequency matching the driving frequencies of 1 and 10 Hz, respectively. Equipment limitations prevent determination of the phase lag between driving signal and sensor response; however, the lack of piezoresistive signal attenuation in the frequency ranged examined may indicate minimal phase angle.

Direct observation of the hair shaft deflection under point loading was enabled with in situ SEM mechanical testing. In these tests, a 40 μm wide sapphire indenter tip deflected the fiber at a location 1 mm from the pore opening. Sequential SEM micrographs were obtained for each 1 μm displacement of the indenter tip. Utilizing these SEM images, spatially resolved vertical displacement maps of the deflected fiber were produced using digital image correlation (DIC). At the maximum indenter tip displacement of 45 μm, the CNT coating near the mouth of the pore is compressed 0.9 μm, and the fiber exits the pore at an angle of 0.8 degrees. Fiber deflection is approximately cubic as a function of fiber position, offset by the angle at which the fiber leaves the pore. A deflection video from FIG. 3a may be found in Supporting Information.

Deflection of the fiber within the embedded pore was modeled using a 1-D finite difference code validated against the analytical solution of a beam supported on an elastic foundation. Because the microcapillary is not electron transparent, the deflection of the fiber within the pore could not be confirmed during the in situ SEM deflection. The numerically modeled system assumes a point load applied 1 mm from the pore opening and linear elastic CNT coating with an equivalent modulus of approximately 300 MPa. Inside the pore, deflection resembles a highly damped sinusoid, with little deflection observed at an embedded depth greater than 700 μm—suggesting that there is not much advantage in sensing for having sensors longer than this length. A maximum compression of 1.2 μm occurs at the mouth of the pore, with the fiber exiting the pore at an angle of 0.86 degrees, both in good agreement with the in situ experimental results. A secondary local maximum displacement of approximately 0.3 μm occurs on the opposite face of the capillary at an embedded depth of 250 μm. Outside the pore, the hair shaft deflection matches well with experimentally obtained results. Guidance from the model suggests that decreasing the microcapillary length will increase the compressive strain realized by the CNT coating for a given shaft deflection, thereby increasing sensitivity.

The novel AHS "hair plug" design using only a CNT-coated glass fiber and glass microcapillary support has demonstrated superior performance as an AHS device. The production method lends itself to inexpensive, scalable manufacturing, and is a form factor that may be integrated in numerous configurations in a variety of host materials of nearly arbitrary shape and composition. The "hair plug" design shows superior sensitivity compared to other hair sensor constructs, while withstanding high accelerations with operational durability that opens applications impractical for hot wire anemometers or pressure sensitive paint. The small scale of the sensor (150-350 μm footprint, >100 μg), low power (<10 μW), sensitivity to low-speed airflow, durability, and ease of fabrication and simple integration mark a new paradigm in small-scale AHS design and application. Broadly envisioned new applications for the devices include spatially distributed sensor networks for advanced navigation of small-scale aircraft and characterization tools to investigate complex aerodynamic phenomena such as flow separation and disturbance propagation. Further, implementation of the sensors considering factors including sensor noise, sensor-to-sensor variability, and complex interactions with the environment (issues also inherent to biological sensory hairs) is currently being examined.

Efforts to grow the nanomaterials ex-situ on fiber (or just in the pores without a fiber) and then assemble will lead to great distortion/damage of the grown nanomaterials during the insertion process.

Growth methods for CNT coated glass fibers were demonstrated, specifically focusing on morphology control. High density, aligned arrays of CNTs were shown on $Al_2O_3$ coated fibers while lower density, lower alignment CNTs were observed on $SiO_2$ surfaces. CNT length generally increased with injection volume and carbon precursor concentration largely had no effect on growth. Measurements from SEM images and carbon oxidation in TGA agree that increased injection volume increases carbon deposition and that concentration in the range tested has little effect. High magnification measurements of the CNT diameter showed that catalyst support layer was the only factor that affected it; however the correlation was not especially strong. This report will help contribute to the understanding of fuzzy fiber synthesis for a variety of multifunctional composites applications.

Creation of self-assembled devices in concentric geometries could create the following nano-devices based on the radial growth of nanomaterials:

(a) A biomimetic artificial hair flow sensor and arrays thereof.

(b) A fiber-based photovoltaic or photosensor with a large surface area collection electrode.

(c) A fast discharging supercapacitor due to the short distances stored charged would travel to reach the CNT 3D electrode.

(d) A fuel cell membrane.

(e) A nano heat exchanger.

(f) A fast responding electrochemical cell including (electrochromic, chemical sensing, etc.)

(g) Energy harvesting devices like thermoelectric, piezoelectrics, charge generation via asymmetric ratcheting of charged fluids, etc.

(h) Vibration sensors.

(i) Mechano-metamaterials

As just described, a novel flow sensor architecture has been conceived and demonstrated. The CNT coated fibers were inserted into a glass microcapillary with electrodes on it. Micromechanical testing was performed to measure the electromechanical response as well as verify the deformation of the flow sensor. These flow sensors may be an enabling for agile flyers and other novel applications of hair flow sensors.

Various modifications to the invention as described may be made, as might occur to one with skill in the art of the invention, within the scope of the claims. Therefore, not all contemplated example embodiments have been shown in complete detail. Other embodiments may be developed without departing from the spirit of the invention or from the scope of the claims.

We claim:

1. A method for making an artificial hair sensor, comprising the steps of:
   (a) depositing an electrode at each end of a microcapillary having an inside surface;
   (b) coating a structural fiber with alumina;
   (c) placing the alumina coated structural fiber inside the microcapillary, wherein part of the alumina coated structural fiber is in a spaced annular relationship with the microcapillary inside surface and part of the fiber extends outside the microcapillary;
   (d) placing the microcapillary and alumina coated structural fiber inside a heated furnace chamber; and, (e) injecting a vaporized catalyst into the heated furnace chamber.

2. The method for making an artificial hair sensor according to claim 1, wherein the vaporized catalyst is a solution of ferrocene in xylene.

3. The method for making an artificial hair sensor according to claim 1, wherein the microcapillary is made of glass.

\* \* \* \* \*